(12) United States Patent
Lin et al.

(10) Patent No.: US 11,772,058 B2
(45) Date of Patent: Oct. 3, 2023

(54) GAS MIXING SYSTEM FOR SEMICONDUCTOR FABRICATION

(71) Applicant: TAIWAN SEMICONDUCTOR MANUFACTURING COMPANY LIMITED, Hsin-Chu (TW)

(72) Inventors: Ming Shing Lin, Hsinchu County (TW); Chin Shen Hsieh, Hsinchu (TW)

(73) Assignee: TAIWAN SEMICONDUCTOR MANUFACTURING COMPANY LIMITED, Hsinchu (TW)

(*) Notice: Subject to any disclaimer, the term of this patent is extended or adjusted under 35 U.S.C. 154(b) by 868 days.

(21) Appl. No.: 16/657,016

(22) Filed: Oct. 18, 2019

(65) Prior Publication Data

US 2021/0113972 A1    Apr. 22, 2021

(51) Int. Cl.
| | | |
|---|---|---|
| C23C 16/40 | (2006.01) | |
| B01F 25/23 | (2022.01) | |
| C23C 16/455 | (2006.01) | |
| H01L 21/67 | (2006.01) | |
| B01F 23/10 | (2022.01) | |
| B01F 35/91 | (2022.01) | |
| B01F 35/10 | (2022.01) | |
| B01F 35/90 | (2022.01) | |
| B01F 101/58 | (2022.01) | |

(52) U.S. Cl.
CPC .............. *B01F 25/23* (2022.01); *B01F 23/19* (2022.01); *B01F 35/1453* (2022.01); *B01F 35/91* (2022.01); *C23C 16/45565* (2013.01); *H01L 21/67017* (2013.01); *B01F 2035/98* (2022.01); *B01F 2101/58* (2022.01)

(58) Field of Classification Search
CPC ...... B01F 25/23; B01F 23/19; B01F 35/1453; B01F 35/91; B01F 2035/98; B01F 2101/58; B01F 35/92; B01F 23/10; C23C 16/45565; C23C 16/4409; C23C 16/452; C23C 16/45572; C23C 16/45512; H01L 21/67017
USPC ........................ 118/715; 156/345.31, 345.32
See application file for complete search history.

(56) References Cited

U.S. PATENT DOCUMENTS

2004/0028810 A1* 2/2004 Grant ................ C23C 16/45563
427/248.1
2007/0119371 A1* 5/2007 Ma .................... H01J 37/32449
118/715
(Continued)

FOREIGN PATENT DOCUMENTS

| CN | 1280005 C | 10/2006 |
|---|---|---|
| CN | 101448977 A | 6/2009 |

(Continued)

*Primary Examiner* — Rudy Zervigon
(74) *Attorney, Agent, or Firm* — COOPER LEGAL GROUP, LLC

(57) ABSTRACT

A gas mixing system for semiconductor fabrication includes a mixing block. The mixing block defines a gas mixing chamber, a first gas channel fluidly coupled to the gas mixing chamber at a first exit location, and a second gas channel fluidly coupled to the gas mixing chamber at a second exit location, wherein the first exit location is diametrically opposite the second exit location relative to the gas mixing chamber and the second gas channel has a bend of 90 degrees or less between an entrance of the second gas channel and the second exit location.

20 Claims, 6 Drawing Sheets

(56) References Cited

U.S. PATENT DOCUMENTS

| | | | | |
|---|---|---|---|---|
| 2007/0128878 A1* | 6/2007 | Izumi | ............... | C23C 8/10 |
| | | | | 438/758 |
| 2009/0165713 A1* | 7/2009 | Kim | ............... | C23C 16/4412 |
| | | | | 118/730 |
| 2012/0100292 A1* | 4/2012 | Park | ............... | C23C 16/4584 |
| | | | | 118/725 |
| 2017/0372914 A1* | 12/2017 | Yamashita | ............... | H01L 21/311 |
| 2018/0175248 A1 | 6/2018 | Ahmed | | |

FOREIGN PATENT DOCUMENTS

| | | |
|---|---|---|
| CN | 102230167 A | 11/2011 |
| CN | 202893212 U | 4/2013 |
| CN | 203737170 U | 7/2014 |
| CN | 106457168 A | 2/2017 |
| CN | 107546152 A | 1/2018 |
| CN | 108728820 A | 11/2018 |
| CN | 209490704 U | 10/2019 |
| EP | 1358927 B1 | 11/2005 |
| JP | H05179426 A | 7/1993 |
| TW | 310447 B | 7/1997 |
| TW | I253479 B | 4/2006 |
| TW | I253476 B | 4/2006 |
| TW | 200916210 A | 4/2009 |
| TW | 201511095 A | 3/2015 |
| TW | 201907598 A1 | 2/2019 |
| TW | I694168 B | 5/2020 |
| WO | 9326038 A1 | 12/1993 |

* cited by examiner

GAS MIXING SYSTEM FOR SEMICONDUCTOR FABRICATION

BACKGROUND

Generally, during semiconductor fabrication various layers of insulating material, semiconducting material, and conducting material are formed to produce a multilayer semiconductor device. A method for forming such materials is through deposition, such as chemical vapor deposition (CVD).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
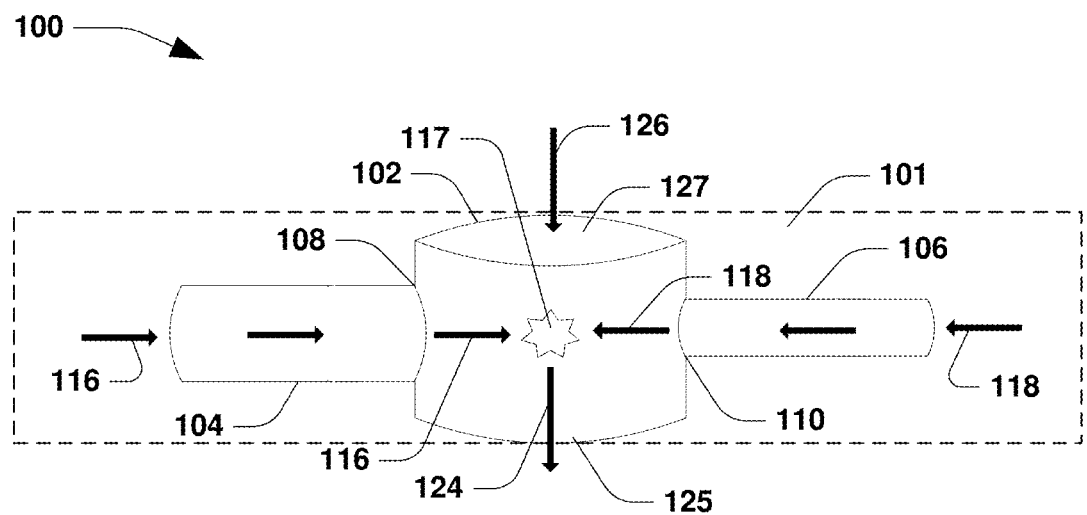
FIG. 1 illustrates a perspective view of at least some of a gas mixing system, according to some embodiments.

The following disclosure provides many different embodiments, or examples, for implementing different features of the provided subject matter. Specific examples of components and arrangements are described below to simplify the present disclosure. These are, of course, merely examples and are not intended limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some embodiments, a gas mixing system includes a mixing block that defines a gas mixing chamber, a first gas channel fluidly coupled to the gas mixing chamber at a first exit location, and a second gas channel fluidly coupled to the gas mixing chamber at a second exit location. In some embodiments, the first exit location is diametrically opposite the second exit location relative to the gas mixing chamber. The diametrically opposite arrangement causes a first gas from the first gas channel and a second gas from the second gas channel to meet head on or at an angle of 180 degrees in the gas mixing chamber to encourage mixing of the first gas and the second gas. In some embodiments, the first gas channel varies in shape, such as width, to control at least one of volume, pressure, or speed of the first gas when entering the gas mixing chamber. In some embodiments, the second gas channel varies in shape, such as width, to control at least one of volume, pressure, or speed of the second gas when entering the gas mixing chamber. In some embodiments, the first gas channel has a bend or non-linear portion to control at least one of volume, pressure, speed, or direction of the first gas when entering the gas mixing chamber. In some embodiments, the second gas channel has a bend or non-linear portion to control at least one of volume, pressure, speed, or direction of the second gas when entering the gas mixing chamber. In some embodiments, controlling at least one of volume, pressure, speed, or direction of at least one of the first gas or the second gas enables a degree of control over mixing the first gas and the second gas in the gas mixing chamber. In some embodiments, one or more variables considered in determining whether or how to control mixing of the first gas and the second gas include a composition of at least one of the first gas or the second gas, a composition of one or more other gases in the gas mixing chamber, such as applied through a top of the gas mixing chamber, a desired composition of a mixed gas resulting from the mixing of gases in the gas mixing chamber, etc. In some embodiments the mixed gas is distributed over a semiconductor wafer in the gas mixing system, such as after the mixed gas exits a bottom of the gas mixing chamber.

According to some embodiments, both a first entrance of the first gas channel and a second entrance of the second gas channel are defined in a sidewall of the mixing block. In some embodiments, the first gas is applied to the first entrance and travels from the first entrance through the first gas channel to the first exit location to enter the gas mixing chamber, such as for mixing with one or more other gasses in the gas mixing chamber. In some embodiments, the first entrance is coupled to a first gas manifold such that the first gas is applied to the first entrance by the first gas manifold, where the first gas manifold is coupled to a source of the first gas. In some embodiments, the second gas is applied to the second entrance and travels from the second entrance through the second gas channel to the second exit location to enter the gas mixing chamber, such as for mixing with one or more other gasses in the gas mixing chamber. In some embodiments, the second entrance is coupled to a second gas manifold such that the second gas is applied to the second entrance by the second gas manifold, where the second gas manifold is coupled to a source of the second gas.

According to some embodiments, having the first entrance and the second entrance in the sidewall facilitates use of the mixing block in a gas mixing system having coplanar manifolds, such as a chemical vapor deposition (CVD) system. Accordingly, as provided herein, a mixing block is available for use in a CVD system where the mixing block is configured to provide a degree of control over the mixing of gasses in the gas mixing chamber of the mixing block so that a desired mixed gas is distributed in a desired manner, such as uniformly, over a semiconductor wafer treated in the CVD system. In some embodiments, the bottom of the gas mixing chamber is defined in a bottom surface of the mixing block. In some embodiments, the bottom surface of the mixing block is adjacent or abuts the sidewall of the mixing block within which the first entrance and the second entrance are defined. In some embodiments, the top of the gas mixing chamber is defined in a top surface of the mixing block. In some embodiments, the top surface of the mixing block is adjacent or abuts the sidewall of the mixing block within which the first entrance and the second entrance are defined. In some embodiments, at least one of the arrangement of the top surface of the mixing block to the sidewall of the mixing block or the arrangement of the bottom surface of the mixing block to the sidewall of the mixing block facilitates use of the mixing block in a gas mixing system, such as a CVD system.

FIG. 1 illustrates a perspective view of a gas mixing chamber 102, a first gas channel 104, and a second gas channel 106 defined within a mixing block 101 (in phantom) of a gas mixing system 100, according to some embodiments. In some embodiments, the first gas channel 104 is fluidly coupled to the gas mixing chamber 102 at a first exit location 108. In some embodiments, the second gas channel 106 is fluidly coupled to the gas mixing chamber 102 at a second exit location 110. According to some embodiments, the first exit location 108 is diametrically opposite the second exit location 110 relative to the gas mixing chamber 102. In some embodiments, diametrically opposite means that the first exit location 108 and the second exit location 110 are separated by an angle of 180 degrees, such that the first exit location 108 is directly across from the second exit location 110 with the gas mixing chamber 102 between the first exit location 108 and the second exit location 110.

In some embodiments, the gas mixing system 100 corresponds to a chemical vapor deposition (CVD) system. In some embodiments, the first gas channel 104 carries a first gas 116 to the gas mixing chamber 102. In some embodiments, the second gas channel 106 carries a second gas 118 to the gas mixing chamber 102. In some embodiments, the first gas 116 and the second gas 118 meet head on in the gas mixing chamber 102, such as due to the diametrically opposite relationship between the first exit location 108 and the second exit location 110. The first gas 116 and the second gas 118 mix 117 in the gas mixing chamber 102 and form a mixed gas 124 that exits through a bottom 125 of the gas mixing chamber 102. In some embodiments the first gas 116 is $N_2O$. In some embodiments, the second gas is $SiH_4$. In some embodiments, at least one of a remote plasma source (RPS) gas or other gas(ses) 126 enter the gas mixing chamber 102 through a top 127 of the gas mixing chamber 102. In some embodiments, at least one of the RPS gas or other gas(ses) are used to clean the gas mixing chamber 102, such as in the presence or absence of one or more other gasses. In some embodiments, at least one of the RPS gas or other gas(ses) mix with at least one of the first gas 116 or the second gas 118 to form the mixed gas 124.

Figure 2:
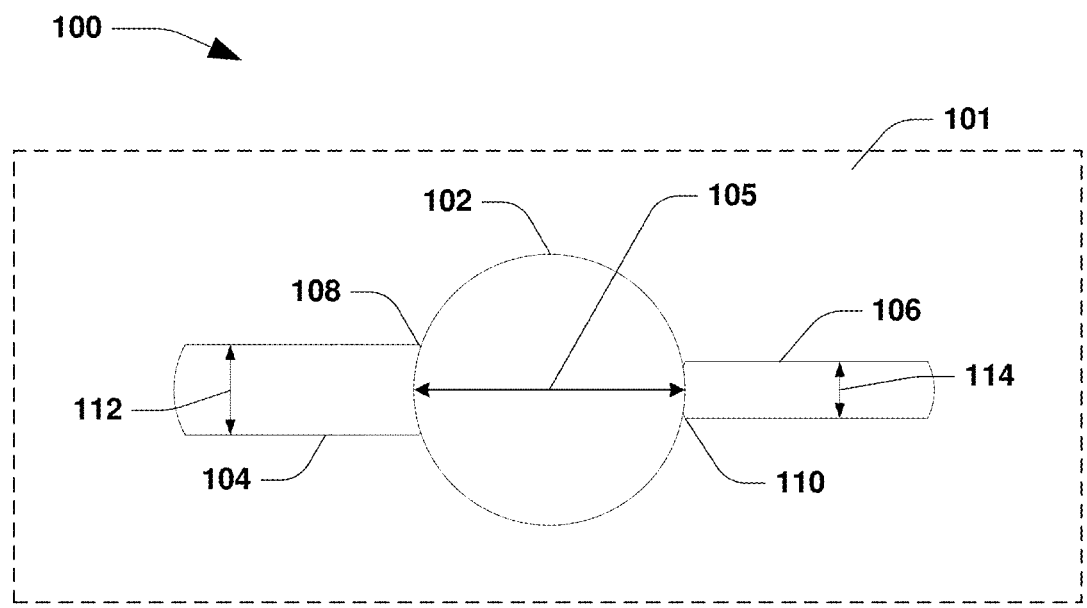
FIG. 2 illustrates a top view of at least some of a gas mixing system, according to some embodiments.

FIG. 2 illustrates a top view of the gas mixing chamber 102, the first gas channel 104, and the second gas channel 106 defined within the mixing block 101 (in phantom) in the gas mixing system 100, according to some embodiments. In some embodiments, the gas mixing chamber 102 has a width 105. In some embodiments, the width 105 of the gas mixing chamber 102 is at least 9 mm. In some embodiments, the first gas channel 104 has a width 112. In some embodiments, the width 112 of the first gas channel 104 is at least 0.7 mm. In some embodiments, the second gas channel 106 has a width 114. In some embodiments, the width 114 of the second gas channel 106 is at least 0.5 mm. In some embodiments, the width 112 of the first gas channel 104 is different than the width 114 of the second gas channel 106. In some embodiments, the width 112 of the first gas channel 104 is the same as the width 114 of the second gas channel 106.

Figure 3:
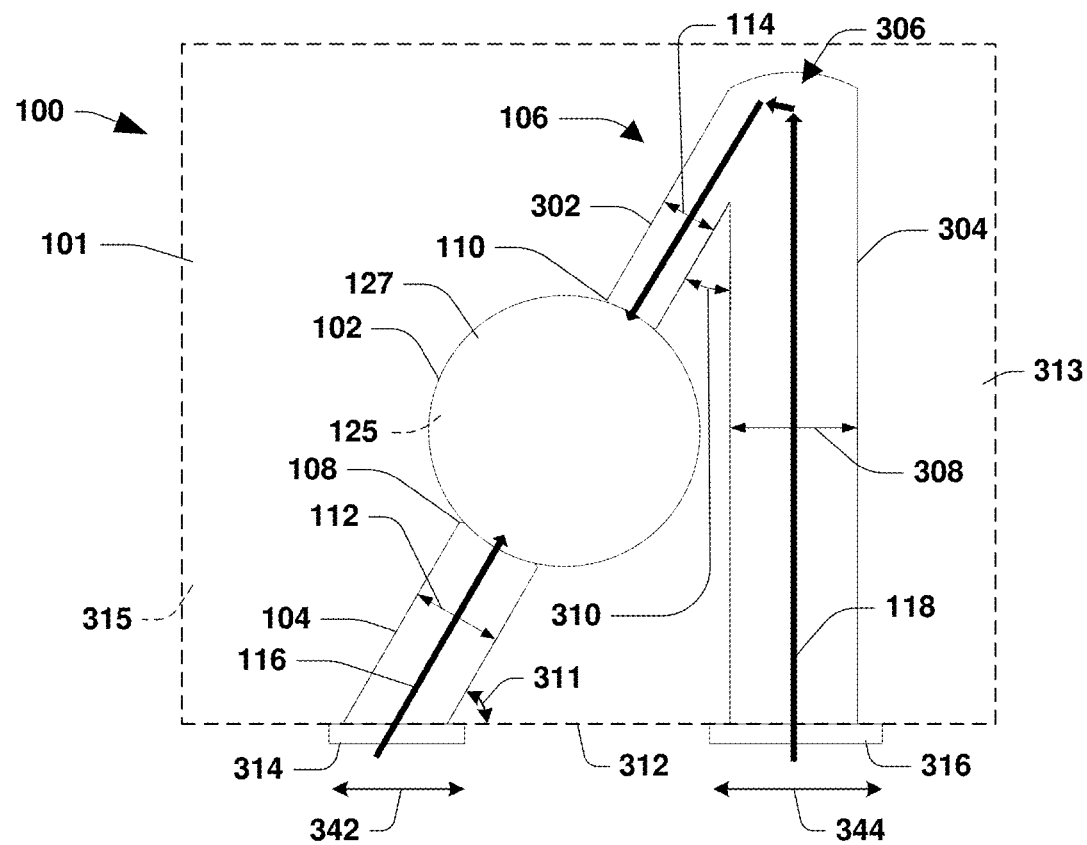
FIG. 3 illustrates a top view of at least some of a gas mixing system, according to some embodiments.

FIG. 3 illustrates a top view of the gas mixing chamber 102, the first gas channel 104, and the second gas channel 106 defined within the mixing block 101 (in phantom) in the gas mixing system 100, according to some embodiments. According to some embodiments, at least one of the first gas channel 104 has one or more portions or the second gas channel 106 has one or more portions. In some embodiments, the second gas channel 106 includes a first portion 302 and a second portion 304. In some embodiments, the first portion 302 has the width 114 while the second portion 304 has a width 308. In some embodiments, the width 308 of the second portion 304 is at least 3 mm. In some embodiments, the width 308 of the second portion 304 is different than the width 114 of the first portion 302. In some embodiments, the width 308 of the second portion 304 is the same as the width 114 of the first portion 302. In some embodiments, the width 112 of the first gas channel 104 is different than at least one of the width 308 of the second portion 304 of the second gas channel 106 or the width 114 of the first portion 302 of the second gas channel 106. In some embodiments, the width 112 of the first gas channel 104 is the same as at least one of the width 308 of the second portion 304 of the second gas channel 106 or the width 114 of the first portion 302 of the second gas channel 106. In some embodiments, the same tooling, such as a drill bit, is used to form at least two of the first gas channel 104, the second portion 304 of the second gas channel 106, or the first portion 302 of the second gas channel 106, such as where at least two of the first gas channel 104, the second portion 304 of the second gas channel 106, or the first portion 302 of the second gas channel 106 have a same width. In some embodiments, utilizing the same tooling to fabricate more than one aspects, element, etc. of the gas mixing system reduces at least one of fabrication time or fabrication cost.

In some embodiments, at least one of the first gas channel 104 has one or more bends or the second gas channel 106 has one or more bends. In some embodiments, the second gas channel 106 includes a bend 306 such that an angle 310 is defined between the second portion 304 of the second gas channel 106 and the first portion 302 of the second gas channel 106. In some embodiments, the angle 310 is less than 90 degrees. In some embodiments, the first gas channel 104 is formed at an angle 311 relative to a sidewall 312 of the mixing block 101. In some embodiments, the angle 311 between the first gas channel 104 and the sidewall 312 facilitates the first exit location 108 being diametrically opposite the second exit location 110 relative to the gas mixing chamber 102. In some embodiments, at least one of the first gas channel 104 is tapered or the second gas channel 106 is tapered. In some embodiments, at least one of the first gas channel 104 has a cross sectional profile that varies or the second gas channel 106 has a cross sectional profile that varies.

In some embodiments, a first entrance 314 of the first gas channel 104 is defined in the sidewall 312 of the mixing block 101. In some embodiments, the first gas 116 is applied to the first entrance 314 and travels from the first entrance 314 through the first gas channel 104 to the first exit location 108 to enter the gas mixing chamber 102, such as for mixing with one or more other gasses in the gas mixing chamber 102. In some embodiments, the first entrance 314 is coupled to a first gas manifold such that the first gas 116 is applied to the first entrance 314 by the first gas manifold, where the first gas manifold is coupled to a source for the first gas. In some embodiments, a second entrance 316 of the second gas channel 106 is defined in the sidewall 312 of the mixing block 101. In some embodiments, the second gas 118 is applied to the second entrance 316 and travels from the second entrance 316 through the second gas channel 106 to the second exit location 110 to enter the gas mixing chamber 102, such as for mixing with one or more other gasses in the gas mixing chamber 102. In some embodiments, the second entrance 316 is coupled to a second gas manifold such that the second gas 118 is applied to the second entrance 316 by the second gas manifold, where the second gas manifold is coupled to a source for the second gas. In some embodiments, a width 342 of the first entrance 314 is different than a width 344 of the second entrance 316. In some embodiments, the width 342 of the first entrance 314 is the same as the width 344 of the second entrance 316. In some embodiments, the width 342 of the first entrance 314 is at least 0.7 mm. In some embodiments, the width 344 of the second entrance 316 is at least 0.5 mm.

According to some embodiments, the first entrance 314 and the second entrance 316 are side by side or adjacent to one another in the sidewall 312 of the mixing block 101. In some embodiments, the first entrance 314, the first gas channel 104, the second entrance 316, and the second gas channel 106 are coplanar such that a plane passes through the first entrance 314, the first gas channel 104, the second entrance 316, and the second gas channel 106. In some embodiments, the plane is parallel to a top surface 313 of the mixing block 101 within which the top 127 of the gas mixing chamber 102 is defined. In some embodiments, the plane is parallel to a bottom surface 315 of the mixing block 101 within which the bottom 125 of the gas mixing chamber 102 is defined. According to some embodiments, having the first entrance 314 and the second entrance 316 in the sidewall 312 facilitates incorporation of the mixing block 101 into a gas mixing system, such as a CVD system, having a defined arrangement of manifolds.

Figure 4:
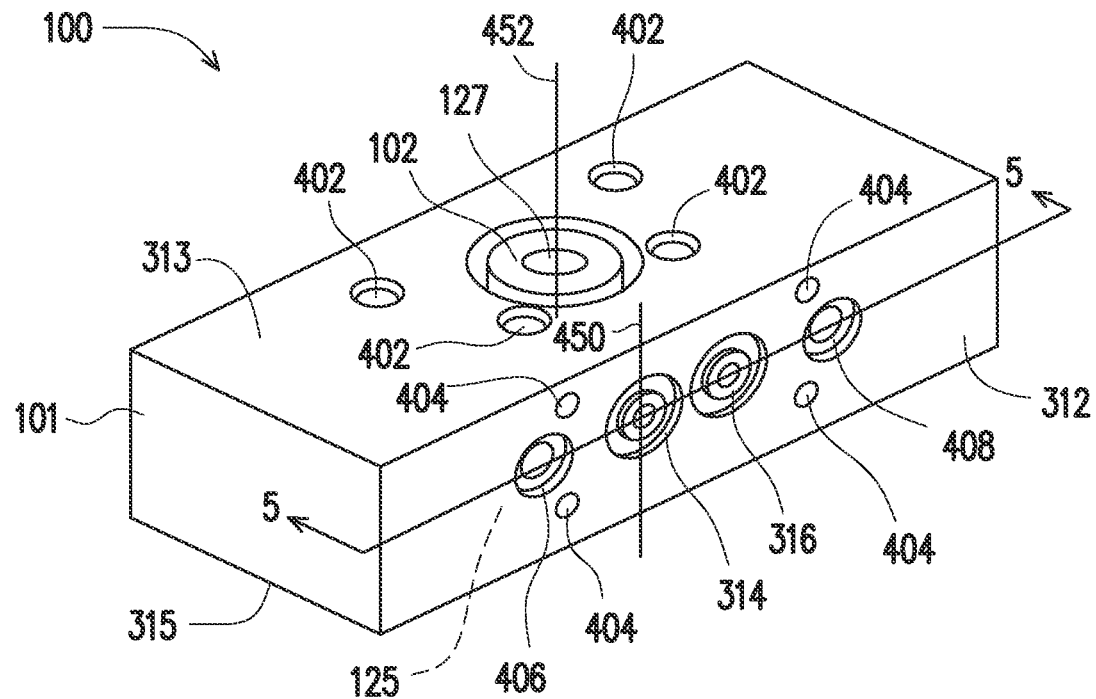
FIG. 4 illustrates a perspective view of at least some of a gas mixing system, according to some embodiments.

FIG. 4 illustrates a perspective view of the mixing block 101 of the gas mixing system 100, according to some embodiments. In some embodiments, one or more fastening instances 402 are present in the top surface 313 of the mixing block 101. According to some embodiments, at least some of the one or more fastening instances 402 cooperate with one or more other aspects of the gas mixing system 100 to mount the mixing block 101 within the gas mixing system 100. In some embodiments, at least some of the one or more fastening instances 402 comprise a recess in the top surface 313, such as to accommodate a bolt, screw, etc. In some embodiments, at least some of the one or more fastening instances 402 comprise a bolt, screw, etc. protruding from the top surface 313. In some embodiments, one or more fastening instances 404 are present in the sidewall 312 of the mixing block 101. According to some embodiments, at least some of the one or more fastening instances 404 cooperate with one or more other aspects of the gas mixing system 100 to mount the mixing block 101 within the gas mixing system 100. In some embodiments, at least some of the one or more fastening instances 404 comprise a recess in the sidewall 312, such as to accommodate a bolt, screw, etc. In some embodiments, at least some of the one or more fastening instances 404 comprise a bolt, screw, etc. protruding from the sidewall 312.

According to some embodiments, the mixing block 101 defines at least one cooling channel. In some embodiments, an inlet 406 of the cooling channel is defined in the sidewall 312. In some embodiments, an outlet 408 of the cooling channel is defined in the sidewall 312. In some embodiments, the location of at least one of the inlet 406 or the outlet 408 is other than as illustrated in FIG. 4, such as where at least one of the inlet 406 is adjacent the second entrance 316 or the outlet 408 is adjacent the first entrance 314.

In some embodiments, a line 450 perpendicular to at least one of the top surface 313 of the mixing block 101 or the bottom surface 315 of the mixing block and that intersects the first entrance 314 does not intersect the second entrance 316 due to the side by side or adjacent arrangement of the first entrance 314 and the second entrance 316. According to some embodiments, the line 450 is parallel to a longitudinal chamber axis 452 of the gas mixing chamber, such that a line that is parallel to a longitudinal chamber axis of the gas mixing chamber and that intersects the first entrance 314 does not intersect the second entrance 316 due to the side by side or adjacent arrangement of the first entrance 314 and the second entrance 316.

In some embodiments, the top surface 313 of the mixing block 101, within which the top 127 of the gas mixing chamber 102 is defined, is adjacent the sidewall 312 of the mixing block 101, within which at least one of the first entrance 314 or the second entrance 316 is defined. In some embodiments, the top surface 313 adjacent the sidewall 312 means that the top surface 313 abuts the sidewall 312. In some embodiments, the top surface 313 adjacent the sidewall 312 means that the top surface 313 and the sidewall 312 meet to form a 90 degree angle. In some embodiments, the bottom surface 315 of the mixing block 101, within which the bottom 125 of the gas mixing chamber 102 is defined, is adjacent the sidewall 312 of the mixing block 101, within which at least one of the first entrance 314 or the second entrance 316 is defined. In some embodiments, the bottom surface 315 adjacent the sidewall 312 means that the bottom surface 315 abuts the sidewall 312. In some embodiments, the bottom surface 315 adjacent the sidewall 312 means that the bottom surface 315 and the sidewall 312 meet to form a 90 degree angle.

Figure 5:
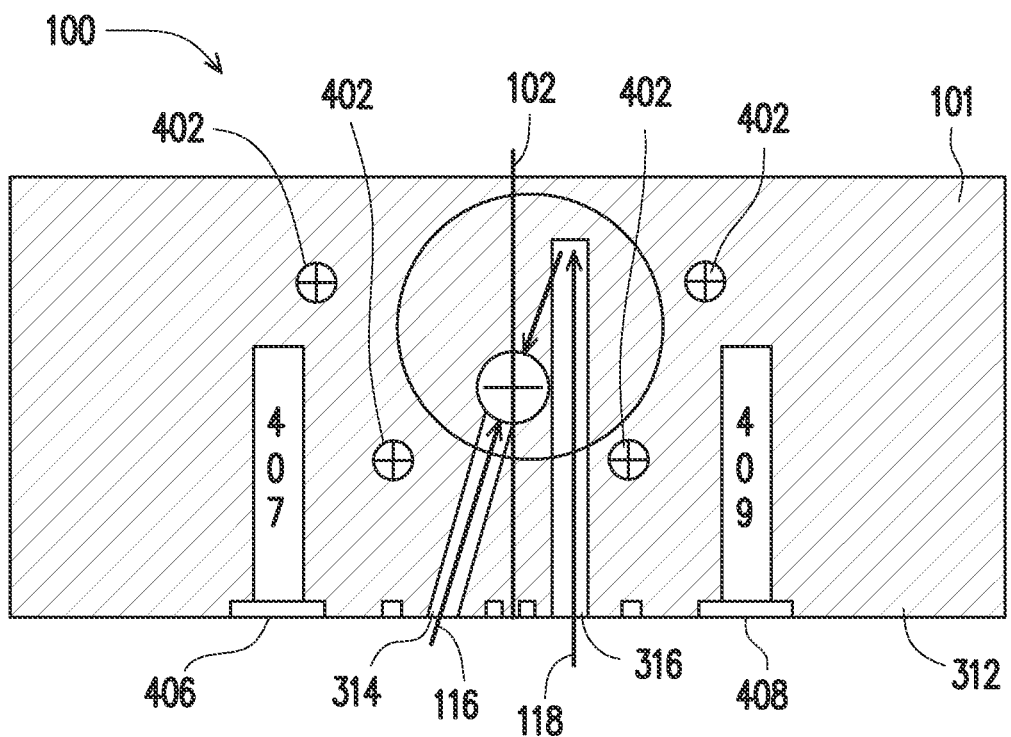
FIG. 5 illustrates a top or cross sectional view of at least some of a gas mixing system, according to some embodiments.

FIG. 5 illustrates a top or cross sectional view of the mixing block 101 of the gas mixing system 100 taken along line 5-5 in FIG. 4, according to some embodiments. FIG. 5 illustrates the first gas 116 and the second gas 118 entering the gas mixing chamber 102 from diametrically opposite directions, according to some embodiments. In some embodiments, the inlet 406 is coupled to a cooling channel 407. In some embodiments, the outlet 408 is coupled to a cooling channel 409. In some embodiments, the cooling channel 407 is fluidly coupled to cooling channel 409 such that there is a single cooling channel. In some embodiments, where there is a single cooling channel a fluid flows into the cooling channel through inlet 406 and the fluid flows out of the cooling channel through outlet 408. In some embodiments, the cooling channel 407 is not fluidly coupled to cooling channel 409. In some embodiments, a fluid flows into the cooling channel 407 through inlet 406 and out of the cooling channel 407 through at least one of inlet 406 or another opening in the mixing block. In some embodiments, a fluid flows into the cooling channel 409 through outlet 408 and out of the cooling channel 409 through at least one of outlet 408 or another opening in the mixing block. According to some embodiments, although the terminology cooling channel is used herein, one or more of the cooling channels are not limited to cooling functions and perform other functions, such as channeling one or more fluids to heat the mixing block 101, etc.

Figure 6:
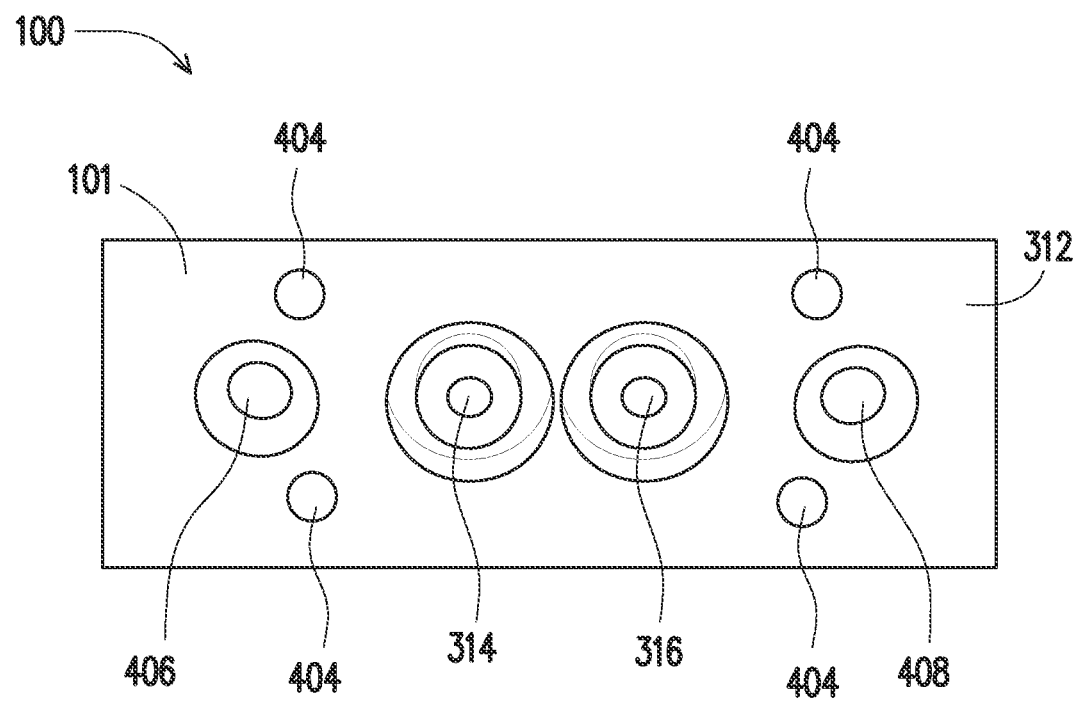
FIG. 6 illustrates a side view of at least some of a gas mixing system, according to some embodiments.

FIG. 6 illustrates the sidewall 312 of the mixing block 101 of the gas mixing system 100, according to some embodiments. In some embodiments, the first entrance 314, the second entrance 316, the inlet 406, the outlet 408, and the one or more fastening instances 404 are defined in the sidewall 312.

Figure 7:
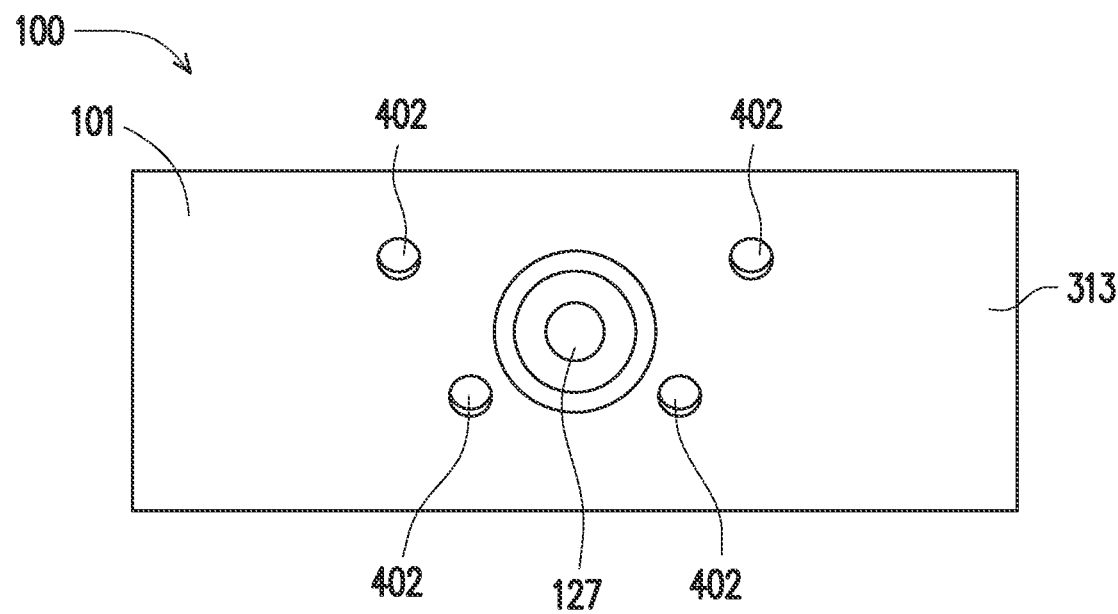
FIG. 7 illustrates a top view of at least some of a gas mixing system, according to some embodiments.

FIG. 7 illustrates the top surface 313 of the mixing block 101 of the gas mixing system 100, according to some embodiments. In some embodiments, the top 127 of the gas mixing chamber and the one or more fastening instances 404 are defined in the top surface 313.

Figure 8:
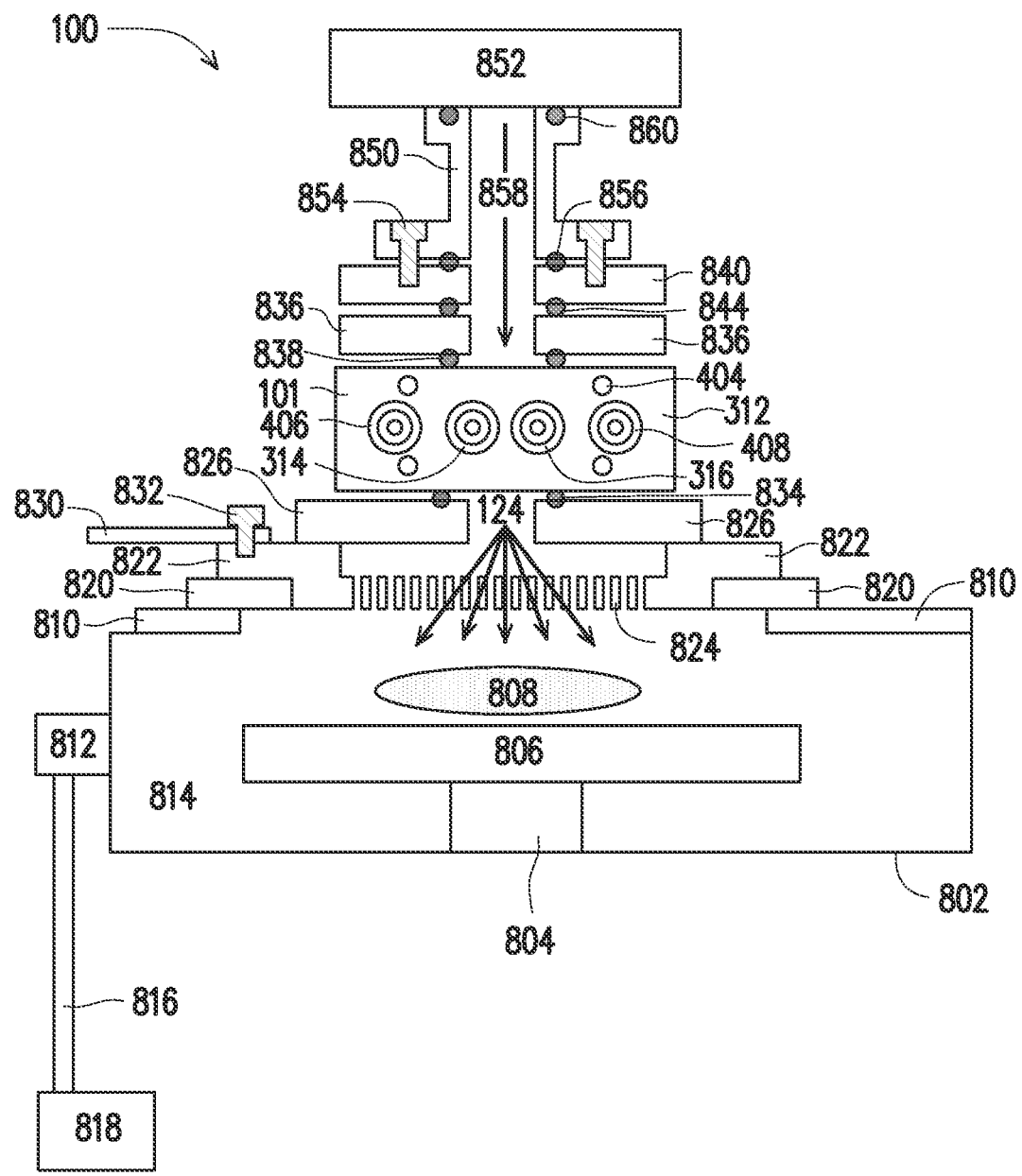
FIG. 8 illustrates a side view of at least some of a gas mixing system, according to some embodiments.

FIG. 8 illustrates the gas mixing system 100 including the mixing block 101, according to some embodiments. In some embodiments, the gas mixing system 100 is a CVD system. The view depicted in FIG. 8 is a cutaway or cross sectional view to illustrate some internal aspects of the gas mixing system 100. However, the mixing block 101 is not depicted as cutaway so as to view the sidewall 312 within which the first entrance 314, the second entrance 316, the inlet 406, the outlet 408, and the one or more fastening instances 404 are defined. In some embodiments, the gas mixing system 100 includes a chamber body 802 within which a wafer support 804 is disposed. In some embodiments, the chamber body 802 comprises aluminum or other suitable materials. In some embodiments, the wafer support 804 comprises aluminum or other suitable materials. In some embodiments, the wafer support 804 includes a temperature regulator 806 to at least one of cool or heat a semiconductor wafer 808 supported by the wafer support 804 and treated by gas mixing system 100. In some embodiments, the temperature regulator 806 comprises aluminum or other suitable materials, such as a heater that heats to 400 degrees Celsius. In some embodiments, the gas mixing system 100 includes chamber lid 810 coupled to the chamber body 802. In some embodiments, the chamber lid 810 comprises aluminum or other suitable materials.

In some embodiments, the gas mixing system 100 includes a pressure regulator 812 to regulate pressure within a chamber 814 defined by the chamber body 802 and the chamber lid 810. In some embodiments, the pressure regulator 812 includes a line 816 coupled to a pump 818 that at least one of pumps gas into the chamber 814, such as to increase the pressure within the chamber 814, or pumps gas out of the chamber 814, such as to decrease the pressure within the chamber 814.

In some embodiments, the gas mixing system 100 includes a first radio frequency (RF) blocking feature 820 to inhibit effects of RF signals upon the gas mixing system 100. In some embodiments, the first RF blocking feature 820 comprises ceramic or other suitable materials. In some embodiments, the first RF blocking feature 820 is in contact with the chamber lid 810. In some embodiments, the gas mixing system 100 includes a gas box 822. In some embodiments, the gas box 822 comprises aluminum or other suitable materials. In some embodiments, the gas box 822 is in contact with the first RF blocking feature 820.

In some embodiments, the gas mixing system 100 includes a shower head 824 defining one or more slits, openings, etc. by or through which the mixed gas 124 is dispersed for even distribution onto the semiconductor wafer 808. In some embodiments, the shower head 824 comprises aluminum or other suitable materials. In some embodiments, the shower head 824 is in contact with at least one of the first RF blocking feature 820 or the gas box 822. In some embodiments, the gas mixing system 100 includes a first mounting plate 826. In some embodiments, the first mounting plate 826 comprises aluminum or other suitable materials. In some embodiments, the first mounting plate 826 is in contact with gas box 822.

In some embodiments, the gas mixing system 100 includes an RF strap 830 to inhibit effects of RF signals upon the gas mixing system 100. In some embodiments, the RF strap 830 comprises a conductive material, such as copper or other suitable materials. In some embodiments, the RF strap 830 is coupled to the gas box 822 by a fastener 832, such as a bolt, screw, etc. In some embodiments, the mixing block 101 is on the first mounting plate 826. In some embodiments, the mixing block 101 is mounted to the first mounting plate 826 by one or more fasteners (not shown). In some embodiments, the one or more fasteners cooperate between a top surface of the first mounting plate 826 and the bottom surface 315 of the mixing block 101. In some embodiments, a first sealant 834, such as an O-ring, is between the mixing block 101 and the first mounting plate 826 to establish a seal, such that is airtight, between the mixing block 101 and the first mounting plate 826. In some embodiments, the first sealant 834 is between the top surface of the first mounting plate 826 and the bottom surface 315 of the mixing block 101.

In some embodiments, the gas mixing system 100 includes a second RF blocking feature 836 to inhibit effects of RF signals upon the gas mixing system 100. In some embodiments, the second RF blocking feature 836 comprises ceramic or other suitable materials. In some embodiments, the second RF blocking feature 836 is on the mixing block 101. In some embodiments, the second RF blocking feature 836 is mounted to the mixing block 101 by one or more fasteners (not shown). In some embodiments, the one or more fasteners cooperate between the top surface 313 of the mixing block 101 and a bottom surface of the second RF blocking feature 836. In some embodiments, a second sealant 838, such as an O-ring, is between the mixing block 101 and the second RF blocking feature 836 to establish a seal, such that is airtight, between the mixing block 101 and the second RF blocking feature 836. In some embodiments, the second sealant 838 is between the top surface 313 of the mixing block 101 and the bottom surface of the second RF blocking feature 836.

In some embodiments, the gas mixing system 100 includes a second mounting plate 840. In some embodiments, the second mounting plate 840 comprises aluminum or other suitable materials. In some embodiments, the second mounting plate 840 is on the second RF blocking feature 836. In some embodiments, the second mounting plate 840 is mounted to the second RF blocking feature 836 by one or more fasteners (not shown). In some embodiments, the one or more fasteners cooperate between a top surface of the second RF blocking feature 836 and a bottom surface of the second mounting plate 840. In some embodiments, a third sealant 844, such as an O-ring, is between the second RF blocking feature 836 and the second mounting plate 840 to establish a seal, such that is airtight, between the second RF blocking feature 836 and the second mounting plate 840. In some embodiments, the third sealant 844 is between the top surface of the second RF blocking feature 836 and the bottom surface of the second mounting plate 840.

In some embodiments, the gas mixing system 100 includes a remote plasma source (RPS) support 850 to support a remote plasma source (RPS) 852. In some embodiments, the RPS support 850 comprises aluminum or other suitable materials. In some embodiments, the RPS support 850 is on the second mounting plate 840. In some embodiments, the RPS support 850 is mounted to the second mounting plate 840 by one or more fasteners 854. In some embodiments, the one or more fasteners 854 cooperate between a top surface of the second mounting plate 840 and a bottom surface of the RPS support 850. In some embodiments, a fourth sealant 856, such as an O-ring, is between the second mounting plate 840 and the RPS support 850 to establish a seal, such that is airtight, between the second mounting plate 840 and the RPS support 850. In some embodiments, the fourth sealant 856 is between the top surface of the second mounting plate 840 and the bottom surface of the RPS support 850.

In some embodiments, the gas mixing system 100 includes the RPS 852 to generate an RPS plasma or gas 858, such as by converting $NF_3$ to plasma, for use in the gas mixing chamber 102 of the mixing block 101 with zero or more other gases, such as to at least one of facilitate cleaning or facilitate generation of the mixed gas 124. In some embodiments, the RPS 852 is on the RPS support 850. In some embodiments, the RPS 852 is mounted to the RPS support 850 by one or more fasteners (not shown). In some embodiments, the one or more fasteners cooperate between a top surface of the RPS support 850 and a bottom surface of the RPS 852. In some embodiments, a fifth sealant 860, such as an O-ring, is between the RPS support 850 and the RPS 852 to establish a seal, such that is airtight, between the RPS support 850 and the RPS 852. In some embodiments, the fifth sealant 860 is between the top surface of the RPS support 850 and the bottom surface of the RPS 852.

Figure 9:
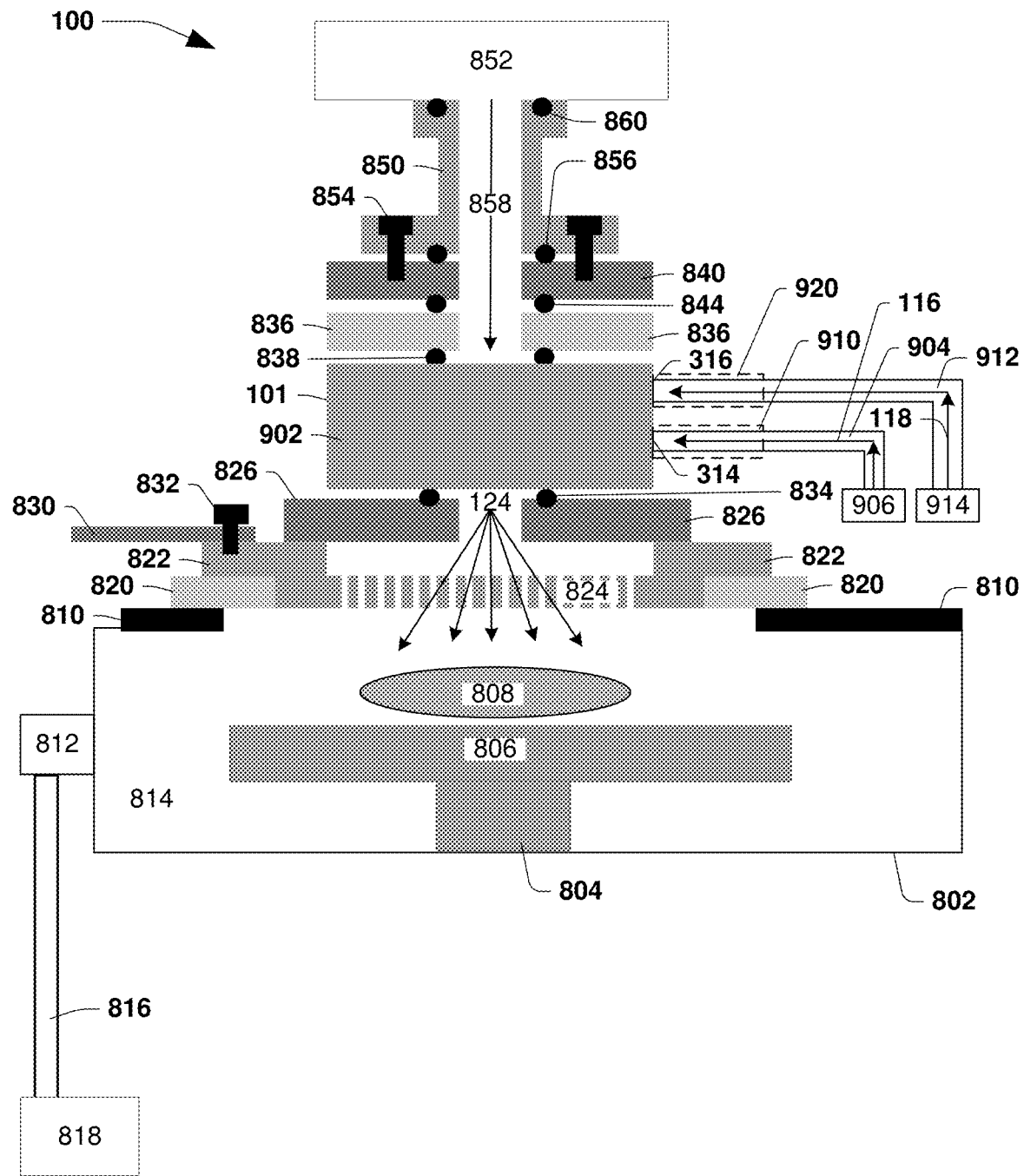
FIG. 9 illustrates a side view of at least some of a gas mixing system, according to some embodiments.

FIG. 9 illustrates the gas mixing system 100 including the mixing block 101, according to some embodiments. The gas mixing system 100 illustrated in FIG. 9 corresponds to the gas mixing system 100 illustrated in FIG. 8 but rotated 90 degrees relative to FIG. 8 such that an end 902 of the mixing block 101 is visible in FIG. 9 as opposed to the sidewall 312. In accordance with some embodiments, a first gas manifold 904 is coupled to the first entrance 314 of the first gas channel. In accordance with some embodiments, a first source 906 of the first gas 116 is coupled to the first gas manifold 904 so that the first gas 116 is fed into the first gas channel. In some embodiments, at least some of the first gas manifold 904 includes a first housing 910. In some embodiments, the first housing 910 comprises Teflon or other suitable materials. In accordance with some embodiments, a second gas manifold 912 is coupled to the second entrance 316 of the second gas channel. In accordance with some embodiments, a second source 914 of the second gas 118 is coupled to the second gas manifold 912 so that the second gas 118 is fed into the second gas channel. In some embodiments, at least some of the second gas manifold 912 includes a second housing 920. In some embodiments, the second housing 920 comprises Teflon or other suitable materials. It is to be appreciated that while the second gas manifold 912 is illustrated above the first gas manifold 904 in FIG. 9, in some embodiments at least some of the second gas manifold 912 would be obscured by the first gas manifold 904 in the orientation in FIG. 9 because the first entrance 314 and the second entrance 316 are side by side or adjacent one another in the sidewall 312 of the mixing block 101 as illustrated at least in FIGS. 4, 6, and 8. It is to be appreciated that while the second gas manifold 912 is illustrated above the first gas manifold 904 in FIG. 9, in some embodiments at least some of the first gas manifold 904 would be obscured by the second gas manifold 912 in the orientation in FIG. 9 because the first entrance 314 and the second entrance 316 are side by side or adjacent one another in the sidewall 312 of the mixing block 101 as illustrated at least in FIGS. 4, 6, and 8.

According to some embodiments, the first gas 116 is introduced into the gas mixing chamber 102 at a first speed and in a first direction, such as due to the configuration of the first gas channel 104, and the second gas 118 is introduced into the gas mixing chamber 102 at a second speed and in a second direction, such as due to the configuration of the second gas channel 106. According to some embodiments, the first speed is different than the second speed and the first direction is diametrically opposite the second direction relative to the gas mixing chamber 102, such as due to the configuration of at least one of the first gas channel 104 or the second gas channel 106.

According to some embodiments, a gas mixing system for semiconductor fabrication includes a mixing block. The mixing block defines a gas mixing chamber, a first gas channel fluidly coupled to the gas mixing chamber at a first exit location, and a second gas channel fluidly coupled to the gas mixing chamber at a second exit location, wherein the first exit location is diametrically opposite the second exit location relative to the gas mixing chamber and the second gas channel has a bend of 90 degrees or less between an entrance of the second gas channel and the second exit location.

According to some embodiments, a gas mixing system for semiconductor fabrication includes a mixing block. The mixing block defines a gas mixing chamber, a first gas channel fluidly coupled to the gas mixing chamber at a first exit location, wherein an entrance of the first gas channel is defined in a sidewall of the mixing block, and a second gas channel fluidly coupled to the gas mixing chamber at a second exit location, wherein an entrance of the second gas channel is defined in the sidewall of the mixing block and the first exit location is diametrically opposite the second exit location relative to the gas mixing chamber.

According to some embodiments, a method for mixing gases in semiconductor fabrication includes introducing a first gas into a gas mixing chamber at a first speed and in a first direction, and introducing a second gas into the gas mixing chamber at a second speed and in a second direction, wherein the first speed is different than the second speed and the first direction is diametrically opposite the second direction relative to the gas mixing chamber.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc., depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A gas mixing system for semiconductor fabrication comprising:
a mixing block defining:
  a gas mixing chamber;
  a first gas channel fluidly coupled to the gas mixing chamber at a first exit location, wherein an entrance of the first gas channel is defined in a sidewall of the mixing block; and
  a second gas channel fluidly coupled to the gas mixing chamber at a second exit location, wherein:
    the first exit location is diametrically opposite the second exit location relative to the gas mixing chamber,
    the second gas channel has a bend of 90 degrees or less between an entrance of the second gas channel and the second exit location,
    the entrance of the second gas channel and the second exit location are defined by the mixing block, and
    the entrance of the second gas channel is defined in the sidewall of the mixing block.

2. The gas mixing system of claim 1, comprising a shower head between the mixing block and a semiconductor wafer support to disperse a gas mixed in the gas mixing chamber over a semiconductor wafer supported on the semiconductor wafer support.

3. The gas mixing system of claim 1, wherein the second gas channel has a first portion having a first width and a second portion having a second width different than the first width.

4. The gas mixing system of claim 3, wherein the first gas channel has a third width.

5. The gas mixing system of claim 4, wherein the third width is different than at least one of the first width or the second width.

6. The gas mixing system of claim 1, wherein at least one of the first gas channel is tapered or the second gas channel is tapered.

7. The gas mixing system of claim 1, wherein at least one of:
the first gas channel has a cross sectional profile that varies between the entrance of the first gas channel and the first exit location, or
the second gas channel has a cross sectional profile that varies between the entrance of the second gas channel and the second exit location.

8. The gas mixing system of claim 1, wherein an entrance of the gas mixing chamber is defined in a top surface of the mixing block adjacent the sidewall of the mixing block.

9. The gas mixing system of claim 1, wherein a line parallel to a longitudinal chamber axis of the gas mixing chamber and that intersects the entrance of the first gas channel does not intersect the entrance of the second gas channel.

10. The gas mixing system of claim 1, comprising:
a first gas manifold coupled to the entrance of the first gas channel for suppling a first gas to the first gas channel for mixing with a second gas in the gas mixing chamber, and
a second gas manifold coupled to the entrance of the second gas channel for suppling a second gas to the second gas channel for mixing with the first gas in the gas mixing chamber.

11. The gas mixing system of claim 1, wherein the mixing block defines a cooling channel and at least one of an inlet of the cooling channel is defined in the sidewall or an outlet of the cooling channel is defined in the sidewall.

12. A gas mixing system for semiconductor fabrication comprising:
a mixing block defining:
  a gas mixing chamber;

a first gas channel fluidly coupled to the gas mixing chamber at a first exit location, wherein an entrance of the first gas channel is defined in a sidewall of the mixing block; and a second gas channel fluidly coupled to the gas mixing chamber at a second exit location, wherein:

an entrance of the second gas channel is defined in the sidewall of the mixing block, the first exit location is diametrically opposite the second exit location relative to the gas mixing chamber, and the second gas channel has a bend of 90 degrees or less between the entrance of the second gas channel and the second exit location.

13. The gas mixing system of claim 12, wherein the second gas channel has a first portion having a first width and a second portion having a second width different than the first width.

14. The gas mixing system of claim 13, wherein the first gas channel has a third width different than at least one of the first width or the second width.

15. A gas mixing system for semiconductor fabrication comprising:

a mixing block defining:

a gas mixing chamber;

a first gas channel fluidly coupled to the gas mixing chamber at a first exit location; and a cooling channel, wherein:

an entrance of the first gas channel is defined in a sidewall of the mixing block, an entrance of the cooling channel is defined in the sidewall of the mixing block such that the entrance of the first gas channel and the entrance of the cooling channel lie within a same plane, a longest dimension of the cooling channel extends in a first direction, and a longest dimension of the first gas channel extends in a second direction different than the first direction.

16. The gas mixing system of claim 15, wherein:

the mixing block comprises a second gas channel fluidly coupled to the gas mixing chamber, and a longest dimension of the second gas channel extends in the first direction.

17. The gas mixing system of claim 15, wherein an entrance of the gas mixing chamber is defined in a top surface of the mixing block.

18. The gas mixing system of claim 12, wherein the entrance of the first gas channel and the entrance of the second gas channel lie within a same plane.

19. The gas mixing system of claim 15, wherein:

a second gas channel is fluidly coupled to the gas mixing chamber at a second exit location, and an entrance of the second gas channel is defined in the sidewall of the mixing block.

20. The gas mixing system of claim 15, wherein:

a second gas channel is fluidly coupled to the gas mixing chamber at a second exit location, and the second gas channel has a bend of 90 degrees or less between an entrance of the second gas channel and the second exit location.

\* \* \* \* \*